US008045138B2

(12) United States Patent
Ogusu

(10) Patent No.: US 8,045,138 B2
(45) Date of Patent: Oct. 25, 2011

(54) SUPPORT PLATE, EXPOSURE APPARATUS HAVING THE SUPPORT PLATE, AND A DEVICE MANUFACTURING METHOD USING THE EXPOSURE APPARATUS

(75) Inventor: Makoto Ogusu, Shimotsuke (JP)

(73) Assignee: Canon Kabushiki Kaisha, Tokyo (JP)

( * ) Notice: Subject to any disclaimer, the term of this patent is extended or adjusted under 35 U.S.C. 154(b) by 443 days.

(21) Appl. No.: 12/198,719

(22) Filed: Aug. 26, 2008

(65) Prior Publication Data

US 2009/0059191 A1 Mar. 5, 2009

(30) Foreign Application Priority Data

Aug. 27, 2007 (JP) .................................. 2007-219920

(51) Int. Cl.
*G03B 27/42* (2006.01)
*G03B 27/52* (2006.01)
(52) U.S. Cl. .......................................... 355/53; 355/30
(58) Field of Classification Search .................... 355/30, 355/53, 72–76
See application file for complete search history.

(56) References Cited

U.S. PATENT DOCUMENTS

| 7,532,309 B2* | 5/2009 | Poon et al. ....................... 355/67 |
| 2007/0242242 A1 | 10/2007 | Nagasaka |
| 2008/0043210 A1* | 2/2008 | Shibuta ............................ 355/30 |
| 2008/0068567 A1* | 3/2008 | Nagasaka et al. ................ 355/30 |

FOREIGN PATENT DOCUMENTS

| JP | 2006-319065 | 11/2006 |
| WO | 2005-055296 | 6/2005 |
| WO | 2006-093340 | 9/2006 |

* cited by examiner

*Primary Examiner* — Hung Henry Nguyen
(74) *Attorney, Agent, or Firm* — Canon USA Inc IP Division

(57) ABSTRACT

An exposure apparatus exposes a substrate through a liquid. The apparatus includes a stage that holds the substrate and moves, and a support plate disposed on the stage and around the periphery of the substrate and supporting the liquid together with the substrate. The support plate includes a liquid-repellent structure portion on the surface of which is formed a texture repellent to the liquid, and a flat portion on the surface of which is formed a film repellent to the liquid.

8 Claims, 6 Drawing Sheets

SUPPORT PLATE, EXPOSURE APPARATUS HAVING THE SUPPORT PLATE, AND A DEVICE MANUFACTURING METHOD USING THE EXPOSURE APPARATUS

BACKGROUND OF THE INVENTION

1. Field of the Invention

The present invention relates to a support plate for an exposure apparatus that exposes a substrate through a liquid, an exposure apparatus having the support plate, and a device manufacturing method using the exposure apparatus.

2. Description of the Related Art

Exposure apparatuses that expose a wafer to a pattern of a reticle are used for manufacturing devices such as semiconductor devices and liquid crystal devices.

Miniaturization of devices requires improvement in the resolving power of projection optical systems of exposure apparatuses. As a means for improving the resolving power, an immersion exposure technique has attracted attention. The immersion exposure technique is a technique in which the space between the last lens of a projection optical system and a wafer is filled with a liquid and the wafer is exposed through the liquid. Exposure apparatuses using the immersion exposure technique are called immersion exposure apparatuses.

Immersion exposure apparatuses mostly use a so-called local fill method in which not the entire wafer surface but only part of the wafer surface including an exposed part is immersed in a liquid.

In the immersion exposure apparatuses using the local fill method, a liquid is supported by a wafer when the central part of the wafer is exposed, whereas the liquid outside the wafer is not supported when the periphery of the wafer is exposed. To solve this problem, WO 05/055296 proposes to provide a support plate on the wafer stage of an immersion exposure apparatus. The support plate is disposed around the periphery of a wafer and supports a liquid outside the wafer. Japanese Patent Laid-Open No. 2006-319065 proposes to form a texture (liquid-repellent structure) on the surface of a support plate to make the surface of the support plate liquid-repellent.

To make the surface of a support plate liquid-repellent, it is necessary to form a fine texture the pitch of which is 500 μm or less. Forming such a texture requires many processes. Therefore, the cost of a support plate in the entire surface of which a texture is formed is high.

When a support plate is detachably attached to a wafer stage, the texture on the surface of the support plate is likely to be broken when the support plate is attached or detached.

SUMMARY OF THE INVENTION

The present invention provides an exposure apparatus having a support plate that is low-cost or the texture (liquid-repellent structure) of which is unlikely to be broken when the support plate is attached or detached.

In an aspect of the present invention, an exposure apparatus exposes a substrate through a liquid. The apparatus includes a stage that holds the substrate and moves, and a support plate disposed on the stage and around the periphery of the substrate and supporting the liquid together with the substrate. The support plate includes a liquid-repellent structure portion on the surface of which is formed a texture repellent to the liquid, and a flat portion on the surface of which is formed a film repellent to the liquid.

Further features of the present invention will become apparent from the following description of exemplary embodiments with reference to the attached drawings.

DESCRIPTION OF THE EMBODIMENTS

Exemplary embodiments of the present invention will now be described in detail with reference to the drawings.

Figure 6:
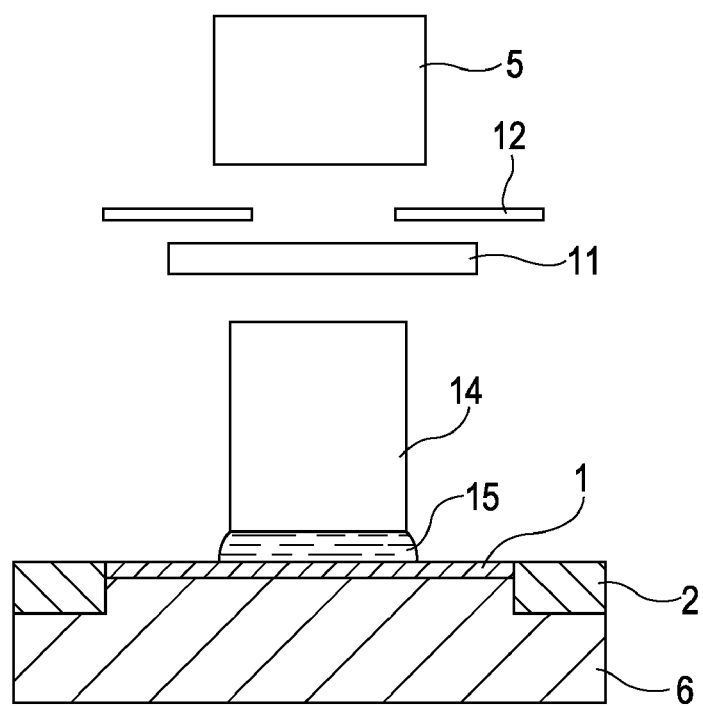
FIG. 6 is a schematic view of an exposure apparatus as an aspect of the present invention.

FIG. 6 is a schematic view of an exposure apparatus of this embodiment.

The exposure apparatus of this embodiment is an immersion exposure apparatus that exposes a wafer 1 through a liquid 15. The immersion exposure apparatus includes an illumination optical system 5, a field stop 12, a projection optical system 14, and a wafer stage (stage) 6. The illumination optical system 5 illuminates a reticle (mask) 11 with exposure light from a not shown exposure light source. The field stop 12 is disposed just above the reticle 11 and defines the illumination region of the reticle 11. The field stop 12 may be disposed at a position optically conjugate to the reticle 11. The projection optical system 14 projects a circuit pattern formed on the reticle 11 onto the wafer 1. A refraction system or a catadioptric system can be used as the projection optical system. The wafer stage 6 holds the wafer 1 and moves. The wafer stage 6 has a wafer chuck (not shown) for holding the wafer 1, and a support plate 2.

This immersion exposure apparatus is a step-and-scan type exposure apparatus. By moving the wafer 1 relative to the projection optical system 14, the wafer 1 is scanned with exposure light in the scanning direction. By scanning the wafer 1, the entire pattern of the reticle 11 is projected onto the exposure region on the wafer 1.

An ArF excimer laser is used as the exposure light source. Pure water is used as the liquid 15. An organic liquid having a refractive index higher than that of pure water may also be used as the liquid 15.

Although the wafer 1 is used as a photosensitive substrate in this embodiment, other substrates such as a glass plate may also be used. The wafer 1 is coated with a resist serving as a photosensitive material.

Figure 1:
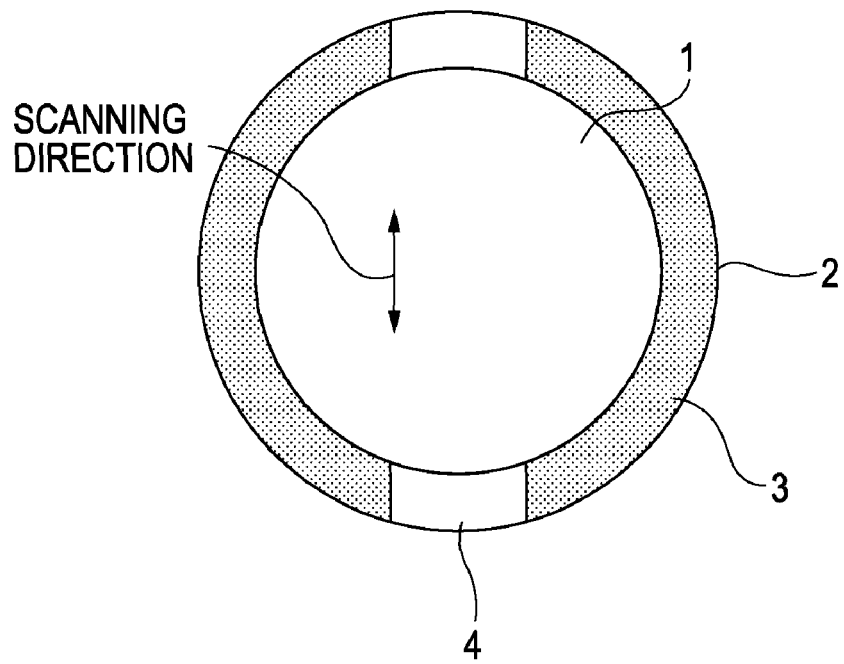
FIG. 1 is a top view of a support plate as an aspect of the present invention.

Next, the support plate 2 of this embodiment will be described. FIG. 1 is a top view of the support plate 2 of this embodiment.

The support plate 2 is disposed, as shown, around the periphery of the wafer 1 and supports the liquid 15 together with the wafer 1. The support plate 2 is detachably attached to the wafer stage 6.

To prevent the liquid from remaining on the surface of the support plate 2, it is desirable that the surface have liquid repellency (water repellency). Specifically, it is desirable that the receding contact angle with respect to the liquid 15 be 70 degrees or more and that the sliding angle with respect to a drop of 50 μl (microliter) of the liquid 15 be 20 degrees or less.

For this purpose, the support plate 2 is provided with textured portions (liquid-repellent structure portions) 3 and flat portions 4. On the surface of each of the textured portions 3 is formed a texture repellent to the liquid 15. On the surface of each of the flat portions 4 is formed a film repellent to the liquid 15.

Figure 8A:
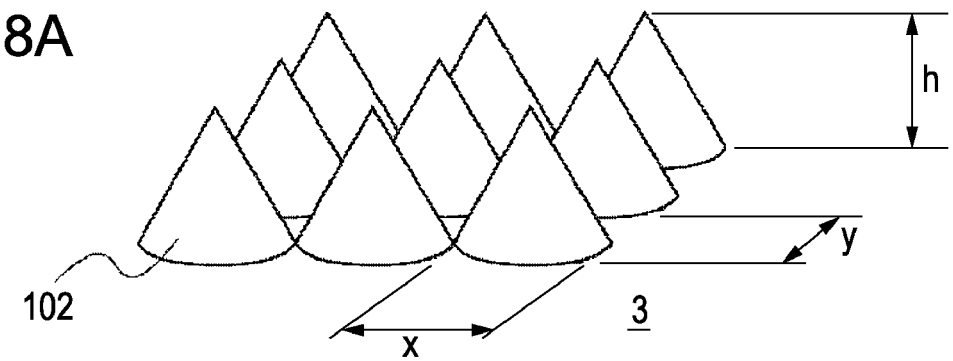
FIG. 8A is a perspective view of a textured portion.
Figure 8B:
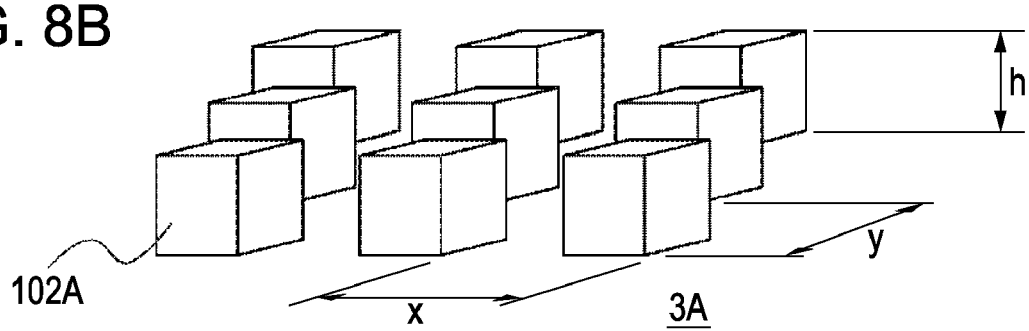
FIG. 8B is a perspective view of a textured portion.

As shown in FIG. 8A, the textured portions 3 each include a plurality of conical protrusions 102. By holding gas among the plurality of protrusions 102, the surfaces of the textured portions 3 have liquid repellency. Therefore, irradiating the surfaces of the textured portions 3 with exposure light does not significantly deteriorate their liquid repellency. The width x and interval (pitch) y of the protrusions 102 are desirably at least 50 nm but no more than 500 μm, more desirably at least 10 μm but no more than 50 μm. The height h of the protrusions 102 is desirably at least 50 nm but no more than 200 μm, more desirably at least 5 μm but no more than 20 μm. The quotient of the height h divided by the interval y (aspect ratio) of the protrusions 102 is desirably two or more. Although the textured portions 3 having the conical protrusions 102 are used in this embodiment, the shape of the protrusions is not limited to a conical shape. For example, as shown in FIG. 8B, textured portions 3A having rectangular solid protrusions 102A can also be used.

On each of the flat portions 4 is formed a film of a liquid-repellent fluorochemical material. A non-fluorochemical material can also be used as a material for a film. However, in any case, irradiating such materials with ultraviolet light, which has a high energy, deteriorates the liquid repellency of films formed of such materials.

The flat portions 4 are disposed only in parts not irradiated with exposure light, that is, only around parts of the periphery of the wafer 1 perpendicular to the scanning direction. The textured portions 3 are disposed in the other parts irradiated with exposure light. Irradiating a liquid-repellent material can deteriorate the liquid repellency of the material. However, in this embodiment, parts of the support plate 2 irradiated with exposure light are provided with the textured portions 3. Therefore, the deterioration in liquid repellency can be reduced. In addition, since not the entire surface of the support plate 2 is textured and flat portions are formed in parts of the surface thereof, the support plate can be made at low cost.

Figure 2:
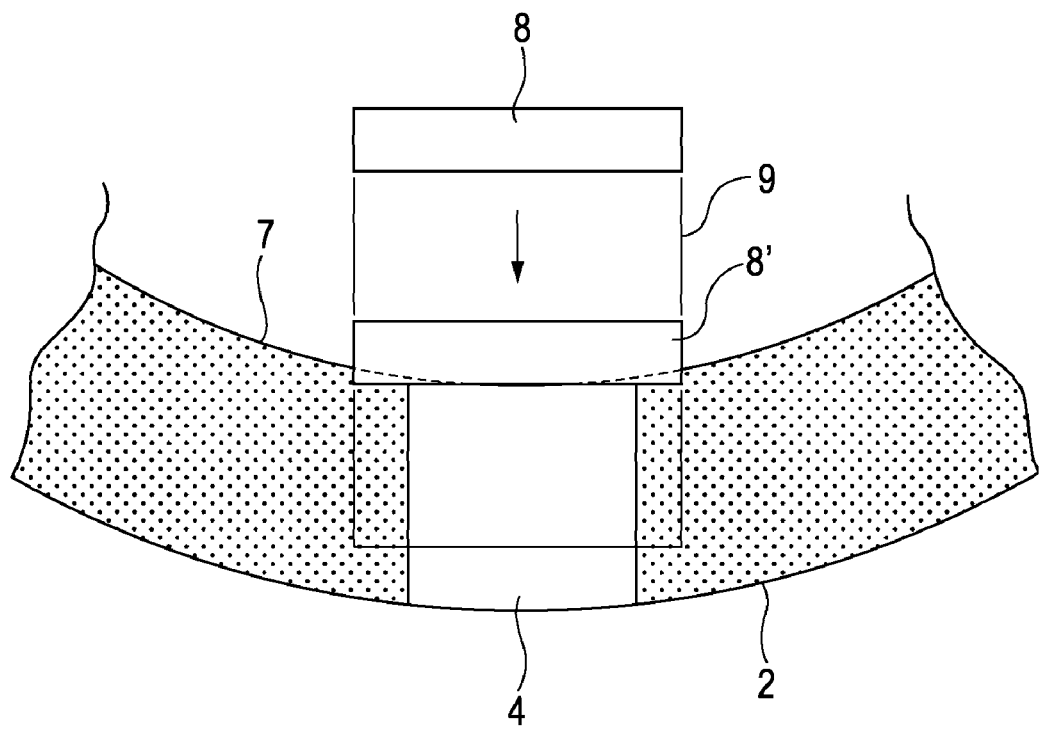
FIG. 2 illustrates a method for preventing flat portions from being irradiated with exposure light.
Figure 3:
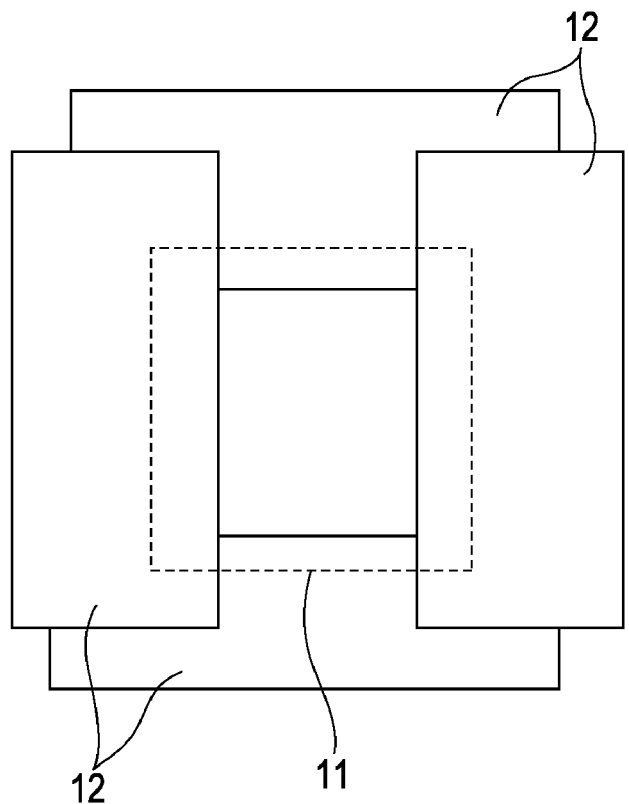
FIG. 3 is a top view of a field stop (masking blade) of an exposure apparatus as an aspect of the present invention.

Next, a method for preventing the flat portions 4 from being irradiated with exposure light will be described with reference to FIGS. 2 and 3. FIG. 2 is a top view of the wafer 1 and the support plate 2 when an exposure region 9 is exposed which is set across the edge 7 of the wafer 1. At this time, as shown, the exposure region 9 includes not only part of the wafer 1 but also part of the support plate 2. Although not shown, the liquid 15 exists on the wafer 1 and the support plate 2. FIG. 3 is a top view of the field stop 12.

As described above, by moving an exposure slit 8 in the scanning direction, the exposure region 9 on the wafer 1 is exposed to the pattern of the reticle 11. The exposure slit 8 is moved toward the flat portion 4 lying in the scanning direction.

Figure 9:
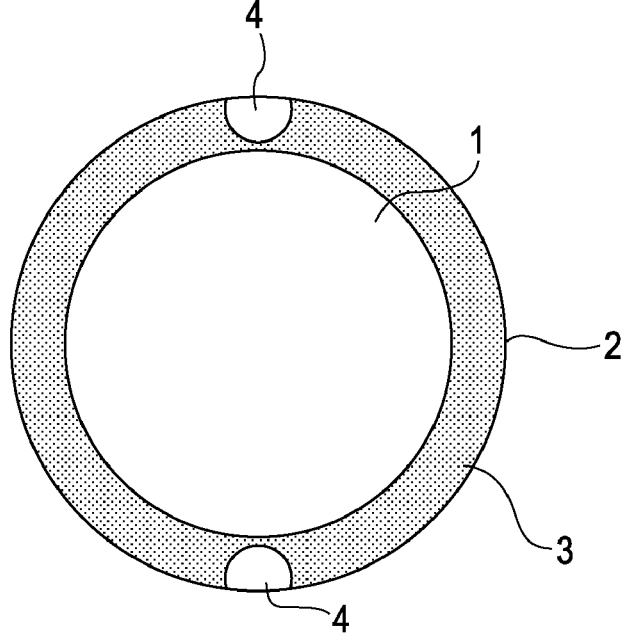
FIG. 9 is a top view of a support plate as an aspect of the present invention.

To prevent the flat portion 4 from being irradiated with exposure light, the light emission of the exposure light source of the immersion exposure apparatus is stopped when the exposure slit 8 has passed the position 8' on the edge 7. Although parts of the flat portion 4 near the edge 7 are exposed, the area of the exposed parts is small because the flat portions 4 lies around part of the periphery of the wafer 1 perpendicular to the scanning direction. The flat portions 4 need not cover the support plate 2 completely in the radial direction as shown in FIG. 1. As shown in FIG. 9, a textured portion 3 may be formed between the edge 7 and each flat portion 4. In this case, the area of parts of the flat portions 4 irradiated with exposure light can be reduced.

Also by using the field stop 12 shown in FIG. 3, the flat portions 4 can be prevented from being irradiated with exposure light. The field stop 12 has four blades, and the size and shape of the opening thereof are variable. The field stop 12 defines the illumination region on the reticle 11 and therefore also defines the exposure slit 8.

To prevent the flat portions 4 from being irradiated with exposure light, the size and shape of the opening are defined by the field stop 12 so that, when the exposure region 9 shown in FIG. 2 is exposed, part of the exposure region 9 beyond the position 8' is not exposed. By using the field stop 12 in this way, the area of parts of the flat portions 4 irradiated with exposure light can be reduced. When the field stop 12 is used, the flat portions 4 may be disposed around parts of the periphery of the wafer 1 parallel to the scanning direction instead of being disposed around parts of the periphery of the wafer 1 perpendicular to the scanning direction.

Figure 4:
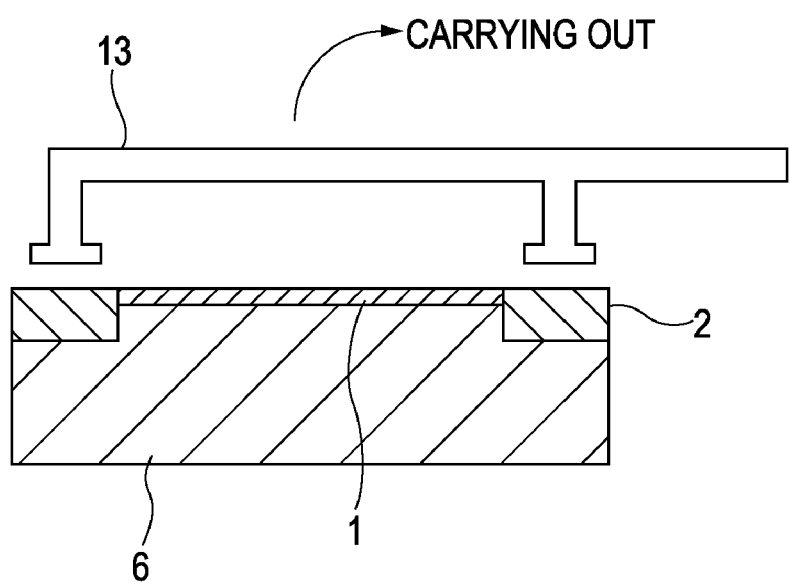
FIG. 4 illustrates a method for replacing a support plate.
Figure 5:
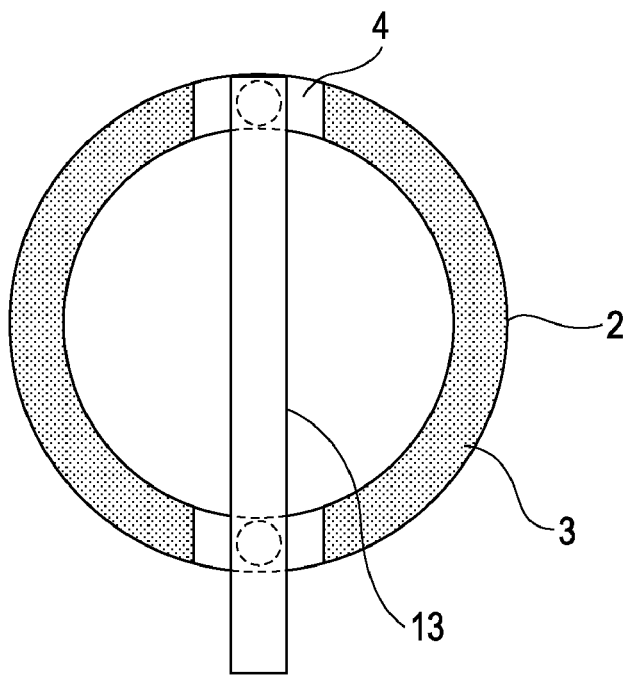
FIG. 5 illustrates a method for replacing a support plate.

Next, a method for replacing the support plate 2 will be described with reference to FIGS. 4 and 5. FIG. 4 is a side view showing the support plate 2 being replaced. FIG. 5 is a top view showing the support plate 2 being replaced.

When the support plate 2 is attached to or detached from the wafer stage 6, a replacing hand 13 is used. The replacing hand 13 is configured to come into contact with the support plate 2 at two places and attracts the support plate 2 (with vacuum or electrostatically). As shown in FIG. 5, the two places at which attracting portions of the replacing hand 13 come into contact with the support plate 2 are both in the flat portions 4.

Figure 10:
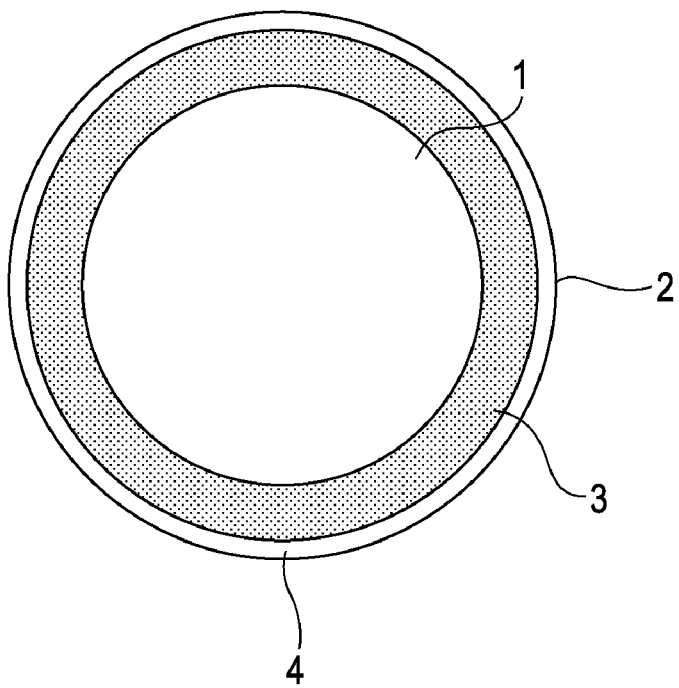
FIG. 10 is a top view of a support plate as an aspect of the present invention.
Figure 11:
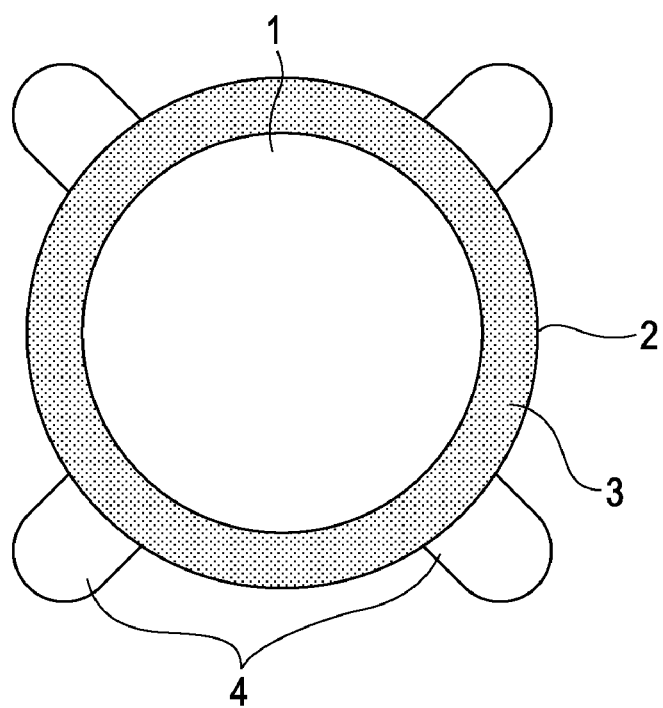
FIG. 11 is a top view of a support plate as an aspect of the present invention.

In the case of this replacing method, when the support plate 2 is replaced, the attracting portions of the replacing hand 13 need not come into contact with the textured portions 3, and therefore the textured portions 3 of the support plate 2 are unlikely to be broken. Alternatively, it is possible to use a support plate such as that shown in FIG. 10 or 11 in which a flat portion or flat portions are formed on the periphery not irradiated with exposure light and to bring the attracting portions of the replacing hand 13 into contact with the flat portion or flat portions when the support plate 2 is replaced.

Figure 7A:
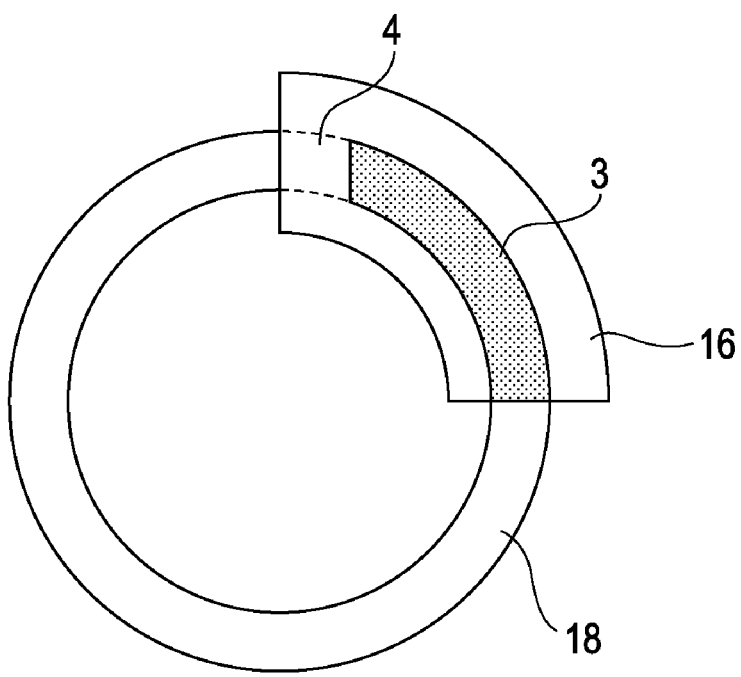
FIG. 7A illustrates a method for manufacturing a support plate.
Figure 7B:
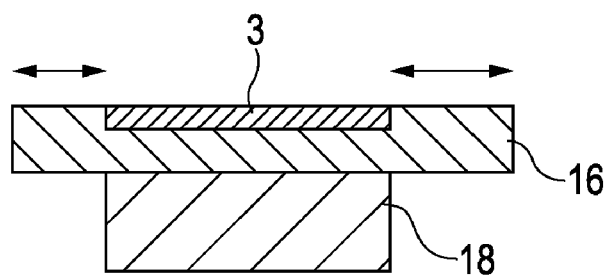
FIG. 7B illustrates a method for manufacturing a support plate.
Figure 7C:
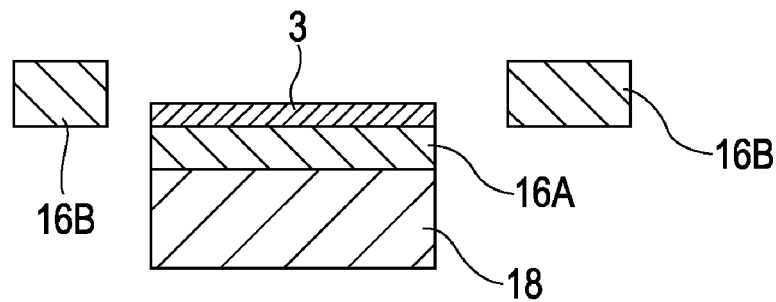
FIG. 7C illustrates a method for manufacturing a support plate.

Finally, a method for manufacturing the support plate 2 will be described with reference to FIGS. 7A to 7C. FIGS. 7A to 7C illustrate a method for manufacturing the support plate 2.

The textured portions 3 are made by processing silicon. The reason is that a technology to form a microstructure in silicon is established and that silicon is opaque to ultraviolet light such as ArF excimer laser light. If the textured portions 3 are opaque, as described below, adhesive used for fixing the textured portions to the main body of the support plate can be prevented from being irradiated with exposure light. The textured portions can also be made of a material other than silicon. For example, silicon dioxide (quartz) can be used. However, silicon dioxide transmits ultraviolet light. Therefore, in order to protect the adhesive, it is necessary, for example, to provide a light-shielding member (light-shielding film) between the silicon dioxide and the adhesive.

The two semicircular textured portions 3 are each divided into two segments. FIG. 7A shows one of the segments, which is bonded to a frame (main body of the support plate) 18. FIGS. 7B and 7C are sectional views thereof.

As shown in FIGS. 7A to 7C, the support plate 2 is manufactured by bonding covers 16 to the frame 18 with adhesive. Each cover 16 includes one of the segments of the textured portions 3. After the bonding, the flat portions 4 are formed by forming films in the non-textured dashed-line regions on the surfaces of the covers 16. Therefore, the plurality of textured portions 3 and the plurality of flat portions 4 are integrated on the support plate 2.

The width of the covers 16 is larger than the width of the frame 18. Therefore, as shown in FIG. 7C, after the covers 16 are bonded to the frame 18, the overhanging parts 16B are cut off with a laser beam machine, leaving the necessary parts 16A.

The two segments of each textured portion 3 are disposed closely so that there is no gap therebetween. In this case, a gap due to tolerance is formed between adjacent non-textured (dashed-line) regions. However, this is not a major problem because the flat portions 4 are formed thereafter.

Devices are manufactured through a process of exposing a photosensitive substrate using an exposure apparatus according to one of the above embodiments, a process of developing the photosensitive substrate, and other known processes.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2007-219920 filed Aug. 27, 2007, which is hereby incorporated by reference herein in its entirety.

What is claimed is:

1. An exposure apparatus that exposes a substrate through a liquid, the apparatus comprising:
a stage configured to hold the substrate and move; and
a support plate detachably disposed on the stage at an outer periphery of the substrate and configured to support the liquid together with the substrate,
wherein the support plate includes a liquid-repellent structure portion of which a surface is provided by a plurality of protrusions repellent to the liquid, and a flat portion on the surface of which is formed a film repellent to the liquid.

2. The exposure apparatus according to claim 1, wherein the apparatus exposes the substrate while moving the stage in a scanning direction, and the flat portion is disposed at a location distant, in the scanning direction, from a center of the substrate.

3. The exposure apparatus according to claim 1, wherein the liquid-repellent structure portion comprises a plurality of liquid-repellent structure portions, the flat portion comprises a plurality of flat portions, and the plurality of liquid-repellent structure portions and the plurality of flat portions are integrated.

4. The exposure apparatus according to claim 1, wherein a quotient of a height of the plurality of protrusions divided by an interval between the plurality of protrusions of the liquid-repellent structure portion is two or more.

5. The exposure apparatus according to claim 1, wherein the surface of the liquid-repellent structure portion or the flat portion has a receding contact angle of 70 degrees or more with respect to the liquid and a sliding angle of 20 degrees or less with respect to a drop of 50 µl of the liquid.

6. A device manufacturing method comprising:
exposing a substrate using the exposure apparatus according to claim 1; and
developing the exposed substrate.

7. A support plate for an exposure apparatus having a stage that holds a substrate and moves and exposing the substrate through a liquid, the support plate being detachably disposed on the stage at an outer periphery of the substrate and being configured to support the liquid together with the substrate, the support plate including a liquid-repellent structure portion of which a surface is provided by a plurality of protrusions repellent to the liquid, and a flat portion on the surface of which is formed a film repellent to the liquid.

8. The exposure apparatus according to claim 1, further comprising a hand configured to come into contact with the flat portion of the support plate to attach the support plate to and detach the support plate from the stage.

* * * * *